(12) United States Patent
Persun et al.

(10) Patent No.: US 7,193,427 B2
(45) Date of Patent: Mar. 20, 2007

(54) METHOD AND APPARATUS FOR MEASURING RELATIVE, WITHIN-DIE LEAKAGE CURRENT AND/OR PROVIDING A TEMPERATURE VARIATION PROFILE USING A LEAKAGE INVERTER AND RING OSCILLATOR

(75) Inventors: Marijan Persun, Beaverton, OR (US); Samie B. Samaan, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/816,018

(22) Filed: Mar. 31, 2004

(65) Prior Publication Data

US 2004/0263192 A1    Dec. 30, 2004

Related U.S. Application Data

(63) Continuation-in-part of application No. 10/610,783, filed on Jun. 30, 2003, now abandoned.

(51) Int. Cl.
   *G01R 31/26* (2006.01)

(52) U.S. Cl. .................................... 324/765; 324/768
(58) Field of Classification Search ............. 324/158.1, 324/765, 760, 763, 768–769; 331/57, 65; 327/262, 141
   See application file for complete search history.

(56) References Cited

U.S. PATENT DOCUMENTS

| 4,922,140 | A | * | 5/1990 | Gahle et al. ................. 327/262 |
| 5,410,278 | A | * | 4/1995 | Itoh et al. ...................... 331/57 |
| 5,796,313 | A | * | 8/1998 | Eitan ............................ 331/57 |
| 6,657,504 | B1 | * | 12/2003 | Deal et al. ..................... 331/57 |

* cited by examiner

*Primary Examiner*—Ha Tran Nguyen
*Assistant Examiner*—Tung X. Nguyen
(74) *Attorney, Agent, or Firm*—Cynthia Thomas Fantz

(57) ABSTRACT

A leakage inverter has a switching delay in one direction that is directly proportional to the drain or gate leakage current of either an n-type or p-type device. For one aspect, a leakage ring oscillator includes an odd number of inverters including at least one leakage inverter such that the frequency of oscillation of the leakage ring oscillator is directly proportional to local device leakage. For another aspect, a leakage ring oscillator may be used to indicate temperature and/or temperature variation on a die.

28 Claims, 13 Drawing Sheets

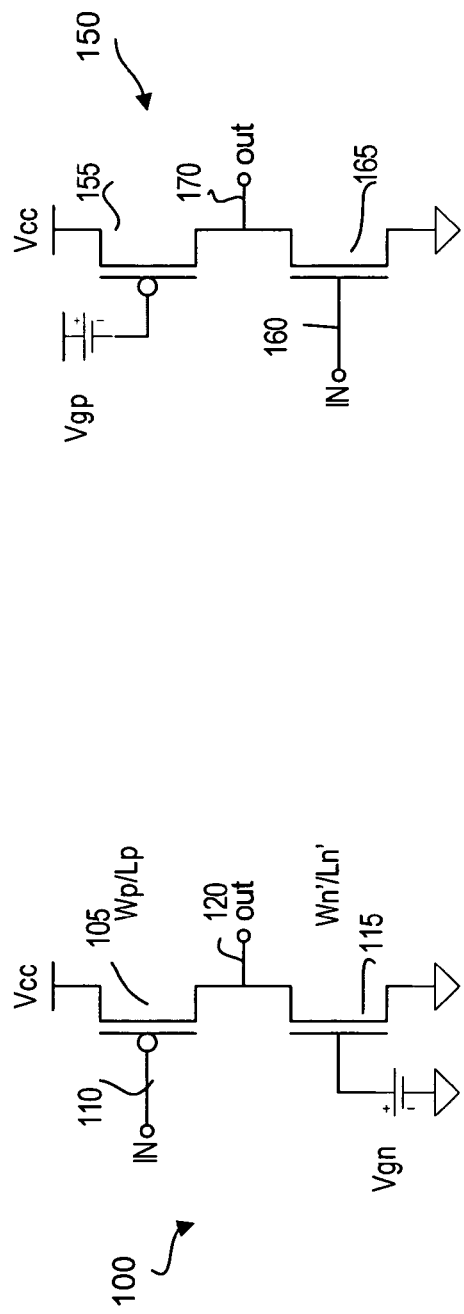
FIGURE 1A
FIGURE 1B
FIGURE 2A
FIGURE 2B

METHOD AND APPARATUS FOR MEASURING RELATIVE, WITHIN-DIE LEAKAGE CURRENT AND/OR PROVIDING A TEMPERATURE VARIATION PROFILE USING A LEAKAGE INVERTER AND RING OSCILLATOR

The present application is a continuation-in-part of U.S. Pat. application Ser. No. 10/610,783 entitled, "A METHOD AND APPARATUS FOR MEASURING RELATIVE, WITHIN-DIE LEAKAGE CURRENT AND/OR PROVIDING A TEMPERATURE VARIATION PROFILE USING A LEAKAGE INVERTER AND RING OSCILLATOR," filed Jun. 30, 2003 and assigned to the assignee of the present invention now abandoned.

BACKGROUND

An embodiment of the present invention relates to the field of integrated circuits and, more particularly, to measuring relative, within-die leakage current and/or providing a temperature variation profile.

In integrated circuits, when a biased metal oxide semiconductor (MOS) transistor is turned off, a small leakage current flows through its drain to its source and substrate due to electron-hole generation, even when the gate to source voltage is zero. In deep sub-1-micron processes, gate leakage current also becomes significant, and may even augment drain leakage. These leakage currents are a source of static current in complementary metal oxide semiconductor (CMOS) very large scale integration (VLSI) integrated circuits, even when their clocks are turned off.

Among other factors, leakage currents are a function of device threshold voltage, channel length, supply voltage, and temperature. Manufacturing variations across a VLSI chip due to variations in doping, ion implantation, and lithography, for example, can cause both the threshold voltages and finished channel lengths of MOS devices to vary across the chip. Variations also occur between manufacturing wafers, lots, and revisions of any particular VLSI process. These variations can cause significant variations in leakage currents at different locations on a die.

Knowledge of leakage current variations across a die can help designers to take various actions to reduce leakage where needed, control the profile across the die and/or across process lots, perform tradeoffs between device speed and leakage, and correlate leakage current variation to manufacturing steps.

For a different aspect of VLSI chip design, testing and operation, it is desirable to obtain a relatively accurate profile of temperature variations across a die during its operation. Having such a profile may enable identification of excessive temperature rises ("hot spots") across a die, and also may help to identify speed-limiting locations on the die during initial validation and testing, for example.

BRIEF DESCRIPTION OF THE DRAWINGS

Embodiments of the present invention are illustrated by way of example and not limitation in the figures of the accompanying drawings in which like references indicate similar elements, and in which:

FIGS. 1A, 1B, 2A, 2B, 2C and 2D are schematic diagrams showing exemplary leakage inverters of various embodiments.

DETAILED DESCRIPTION

Figure 2D:
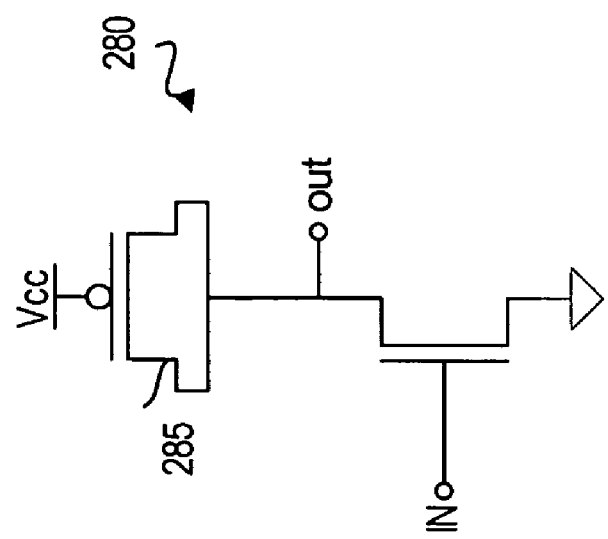

A method and apparatus for detecting leakage current and/or temperature variations on an integrated circuit die are described. In the following description, particular types of integrated circuits, circuit configurations, system configurations, etc. are described for purposes of illustration. It will be appreciated, however, that other embodiments are applicable to other types of integrated circuits, circuit configurations and/or system configurations.

For one embodiment, a leakage inverter circuit has a switching delay in one direction that is directly proportional to the drain leakage current of either an n-type metal oxide semiconductor (nMOS) or p-type metal oxide semiconductor device (pMOS), depending on its configuration as described in more detail below. The leakage inverter includes an n-type and a p-type device, wherein, during operation, an input signal is received at a gate of a first one of the devices and the gate of the second device is coupled to receive a supply voltage, also referred to herein as a bias voltage, that causes the gate to source voltage Vgs of the second device to be below its threshold voltage.

A leakage inverter of another embodiment may instead be configured such that both the source and drain of the second device are coupled to receive the same supply voltage and the gate of the second device is coupled to the drain of the first device and the output node of the inverter. A leakage inverter of still another embodiment may have the source and drain of the second device coupled to the drain of the first device and the gate of the second device may be coupled to receive a supply voltage. The leakage inverter of such embodiments has a switching delay in one direction that is directly proportional to the gate leakage current of the second device.

A leakage ring oscillator according to one embodiment includes an odd number of inverters including at least one leakage inverter. For one aspect, the frequency of oscillation of the leakage ring oscillator is directly proportional to local device leakage and inversely proportional to node capacitance. For another aspect, a leakage ring oscillator may be used to indicate temperature variation. Thus, by providing various leakage ring oscillators across a die according to one embodiment, relative leakage current and/or thermal variations can be measured. Details of these and other embodiments are provided in the description that follows.

FIG. 1A is a schematic diagram of a leakage inverter 100 of one embodiment. The leakage inverter 100 includes a p-type transistor 105 having a gate coupled to receive an input signal over a signal line 110. The leakage inverter 100 also includes an n-type transistor 115 coupled to the p-type transistor 105 as shown. A gate of the n-type transistor 115 is coupled to receive a supply voltage Vgn that causes its gate to source voltage Vgs to be less than the threshold voltage Vt for the device 115. For one embodiment, the gate of the transistor 115 may be directly coupled to its source. An output signal is provided at an output node 120. The leakage inverter 100 may be referred to herein as an n-type drain leakage inverter, because the operation of the leakage inverter 100 depends on the drain leakage current of the n-type device when the input signal is high.

FIG. 1B is a schematic diagram of a complementary leakage inverter 150, which may be referred to herein as a p-type drain leakage inverter. The inverter 150 includes a p-type device 155 having its gate coupled to receive a supply voltage Vgp that causes the gate to source voltage Vgs of the device 155 to be less than the threshold voltage Vt of the device 155, and an n-type device 165 coupled to receive an input signal over a signal line 160. As for the n-type device, for one embodiment, the gate of the p-type device 155 may be coupled directly to its source for one embodiment.

Referring to the n-type leakage inverter 100 for purposes of example, in operation, under certain device sizing considerations discussed in more detail below, when the input signal IN at the input 110 is a logical 0 (or ground), the p-type transistor 105 turns on causing the voltage at the output node 120 to transition to a logical 1 (or Vcc). When the input signal IN then transitions to a logical 1, the p-type device 105 turns off and the leaky n-type device 115 slowly dissipates the charge at the output node 120 until the output voltage becomes nearly 0. In this manner, the circuit 100 operates as an inverter: The logical value at the output 120 of the leakage inverter 100 is the opposite of the logical value at the input 110 after a certain time delay that is typically longer than the delay of a conventional CMOS inverter for at least one transition direction.

For one embodiment, in order to provide for proper operation of the leakage inverter 100 as described herein, certain relative device sizes and relationships may be observed in designing the leakage inverter 100.

First, for example, for one embodiment, the leakage inverter 100 is designed such that the leakage current of the n-type device 115 is significantly stronger than that of the p-type device 105 when both are in an off state (i.e. the signal at the input 110 is a logical 1). This may be achieved by selecting the width Wn' of the n-type device to be many times larger than the width Wp of the p-type device and selecting the channel length Lp of the p-type device 105 to be longer than the process minimum. By designing the circuit 100 in this manner, the switching time of the p-type device 105 is much smaller than that of the leakage-based downward switching delay of the node 120. This is because, as the channel length of the pMOS 105 device is made longer, its leakage drops exponentially, while its normal switching speed drops only linearly. Thus, by making the pMOS device 105 bigger (wider), its fast switching speed relative to the leaky nMOS device 115 may be restored, and its leakage may be kept relatively small compared to the nMOS device 115.

In selecting the relative widths Wn' and Wp of the n-type and p-type devices, respectively, the ratio of Wn' to Wp depends on, for example, the desired accuracy of the leakage measurement and the expected degree of on-die leakage variation. Further, at an outer boundary, the selected relative widths Wn' and Wp should not cause the n-type device to dominate to the extent that the output node 120 cannot be pulled up when the p-type device 105 is enabled.

Second, the channel width Wn' of the n-type device 115 is selected to be large, i.e. many times the minimum width, to improve the accuracy of the relative measurement of leakage current per unit of leaky device channel width and to reduce corner effects. For embodiments for which the n-type device 115 is multi-legged, each leg of the device may be several times the minimum width, but less than the specified maximum dimension for a leg. For other embodiments, the legs may be at or only a few times the minimum width where narrow devices exhibit different leakage per unit of width than wider devices.

Third, the strength of the p-type device (Wp/Lp) is selected to be sufficient to pull up the output node 120 relatively quickly when the value at the input 110 is a logical 0 and to overcome, easily, any down pull exerted by the leaky n-type device 115. The selected strength for a particular leakage inverter may depend on several factors including the overall goals of the design. For current processes, this strength is relatively easy to attain because drain leakage current is on the order of about $\frac{1}{1000}$ of normal channel "ON" current. It will be appreciated that this value may change with future processes.

The up-switching delay of the inverter 100 is a function of the total output node 120 capacitance, and the pull-up (ON) current of the PMOS device. The down-switching delay is a function of the same node capacitance, and the drain leakage current of the leaky n-type device.

Following the above-described sizing guidelines, it is possible to design the circuit 100 such that the pull-up delay is very small relative to the pull-down delay. For example, the n-type and p-type devices 115 and 105, respectively, may be sized according to the above constraints in such a way as to make the pull-down delay many tens of times slower than the pull-up delay.

While the operation and sizing considerations of a leakage inverter of one embodiment are described above in reference to the n-type leakage inverter 100, it will be appreciated that the p-type leakage inverter 150 operates in a similar, but complementary manner. Further, it will be appreciated that similar, but interchanged (i.e. adjusted for complementary device types) device channel width and length sizing considerations apply to the p-type drain leakage inverter 150 for one embodiment.

FIG. 2A shows an n-type leakage inverter 200 of another embodiment. For the leakage inverter 200, the leaky device 215 is connected differently, such that the high-to-low transition delay of the inverter 200 is a function of the leakage current through the gate of the device 215, rather than the leakage current through its drain as for the embodiments of FIGS. 1A and 1B.

For the leakage inverter 200, the gate of the leaky device 215 is connected to the output node 220, while the drain and the source of the leaky device 215 are both grounded. For this embodiment, the gate of transistor 215 is designed to be large enough such that it possesses appreciable gate leakage current capability, which maintains the remaining device sizing considerations previously enumerated in reference to the embodiments of FIGS. 1A and 1B.

Depending on the characteristics of the particular fabrication process, the gate of the leaky device may be a one- or a multi-fingered implementation, where each finger has a channel length substantially equal to the standard minimum channel length for the process. For other implementations, it may be more desirable to save layout room, and to design the gate such that it has a channel length much longer than the minimum, thereby building up gate area substantially and increasing the gate leakage current to the point at which it becomes large enough to enable the inverter 200 to operate with the desired transition delay.

FIG. 2B is a schematic diagram illustrating a p-type leakage inverter 250 of another embodiment that is similar, but complementary, in configuration and operation to the leakage inverter 200 of FIG. 2A. The leakage inverter 250 includes a leaky p-type device 265 coupled as shown. Similar, but complementary, sizing considerations apply to the leakage inverter 250.

Figure 2C:
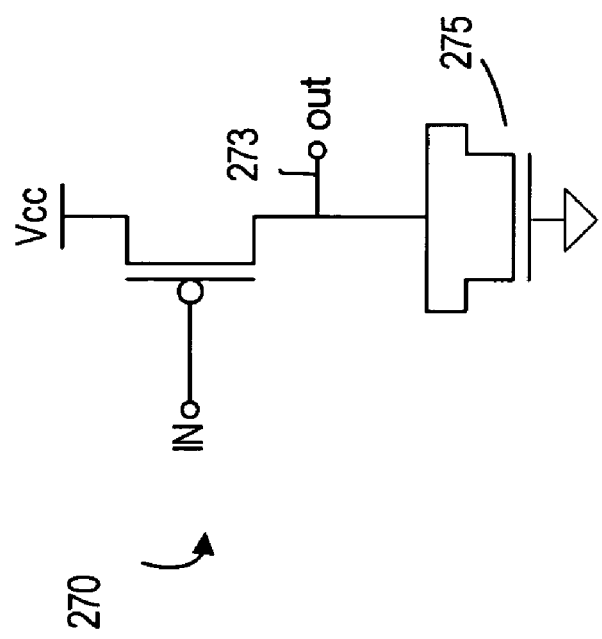

FIGS. 2C and 2D are schematic diagrams showing n- and p-type leakage inverters, 270 and 280, respectively, of still another embodiment. The leakage inverters 270 and 280 are similar to the leakage inverters of FIGS. 2A and 2B, respectively, except that the leaky transistors are coupled in a different manner.

More specifically, referring to FIG. 2C, the leaky transistor 275 has its source and drain coupled to the drain of the first device and its gate coupled to ground. Similarly, the leakage inverter of FIG. 2D includes a leaky transistor 285 having its source and drain coupled to the source of the first device and its gate coupled to Vcc. Sizing considerations for the devices of the leakage inverters of FIGS. 2C and 2D may be similar to sizing considerations for the leakage inverters of FIGS. 2A and 2B.

Using the leakage inverters of FIGS. 2C and 2D, it may be possible for some embodiments, to more closely emulate the gate leakage of nearby devices as compared to other leakage inverter implementations.

As described above, leakage inverters 100, 150, 200, 250, 270 and 280 each provide an inverter function and have a delay in one signal transition direction that is dominated by leakage. Using one or more leakage inverters of various embodiments together with conventional gates, it is possible to design a ring oscillator to provide a signal having a frequency that is dominated by delays determined largely by leakage.

Figure 3:
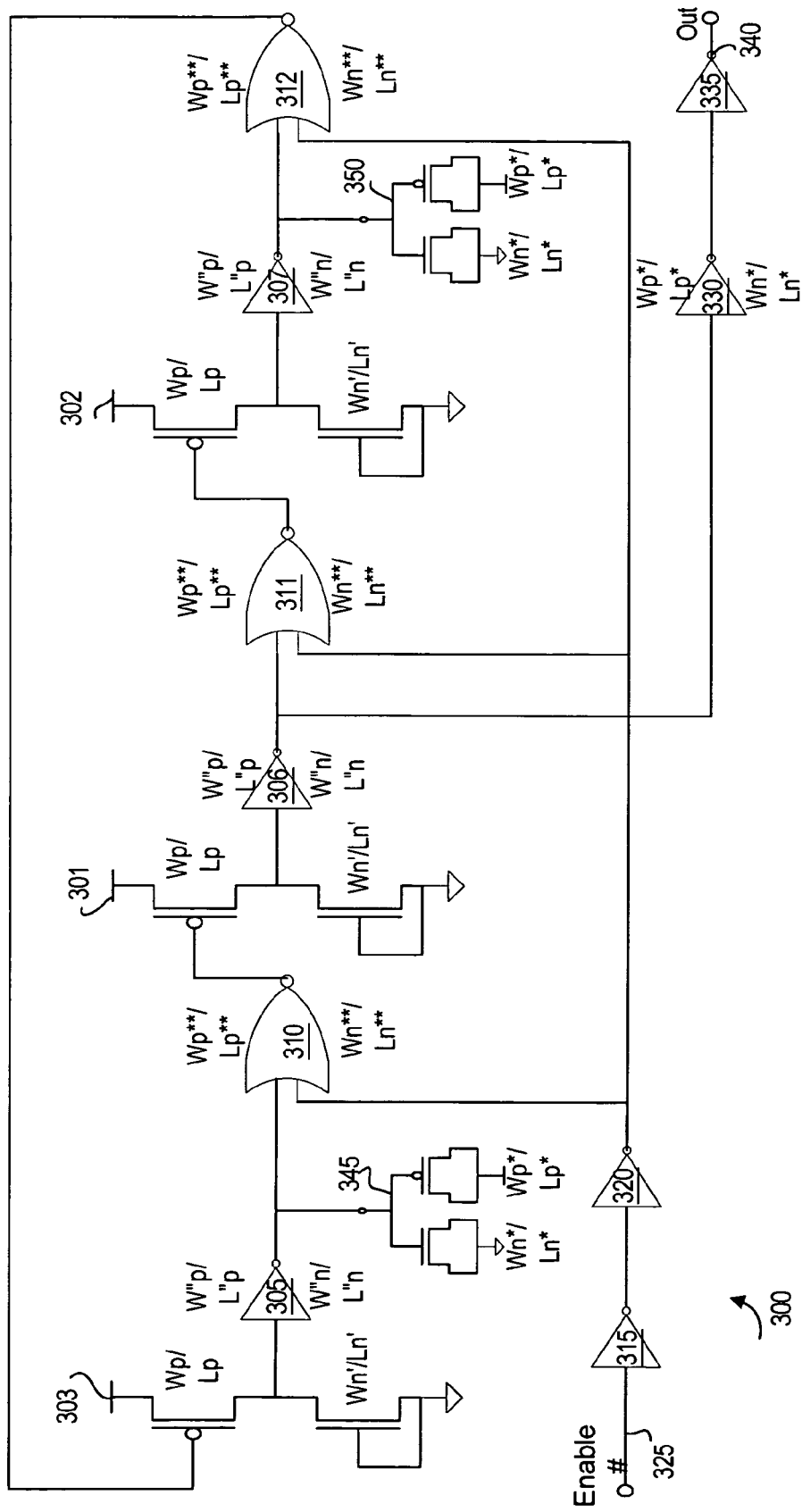
FIGS. 3 and 4 are schematic diagrams showing exemplary ring oscillators of one embodiment that may include one or more of the leakage inverters of FIGS. 1A and 1B.

FIG. 3 is a schematic diagram of an exemplary leakage ring oscillator 300 of one embodiment that includes n-type leakage inverters 301–303 that are similar in configuration and operation to the leakage inverter 100 described above in reference to FIG. 1A.

The leakage ring oscillator 300 includes 9 inverting stages, including the 3 leakage inverters 301–303. The three leakage inverters 301–303 have substantially negligible pull-up delays, but relatively long pull-down delays determined by their n-type transistors, each of which has its gate shorted to ground for this embodiment. It will be appreciated that, for other embodiments, the gates of one or more of the leakage inverters 301–303 may be coupled to receive a different voltage that provides a gate-to-source voltage Vgs less than the threshold voltage for the respective leaky device.

Further, for other embodiments, a different number of leakage inverter stages may be used. For the exemplary embodiment described herein, however, using more than three leakage inverter stages may make the frequency of the output signal from the leakage ring oscillator 300 inconveniently small and may not appreciably improve the accuracy of the leakage measurement. Conversely, at least three leaky stages may be recommended for the following reasons:

If only one leaky stage is used, then the remaining even number of conventional CMOS inverters would need to have a zero-to-one transition time that is several (e.g. more than 5) times larger than the pull-up transition time of the p-type device in the single leakage inverter stage. In this manner, the worst within-die variation, which might cause this delay to be small, would still give the p-type device in the n-type leakage inverter enough time to charge the output node to Vcc. The problem, then, is that at high temperatures or for very short channel lengths, the pull-down leakage-based switching delay becomes much shorter due to increased leakage current. Further, the multi-stage CMOS delay subsequently becomes relatively comparable to the pull-down leakage-based switching delay, such that error may be introduced in any measurements that might be attempted to extract the temperature dependence of the leakage current, or leakage current variation around the die at high temperatures.

If, instead, two leaky stages are used, then there would be an odd number of conventional CMOS inverters in the oscillator. This arrangement would cause one of the two leaky inverters to be driven by an odd number of stages, while the other leaky inverter is driven by an even number of stages. The result would be an asymmetric drive of the leaky inverter stages with dissimilar waveforms. Further, one of the leaky inverters would be subject to the same situation as described above in which the p-type transistor must be given enough time to reach the respective supply rail.

A leakage oscillator, such as the leakage oscillator 300 illustrated in FIG. 3, that includes an odd number of at least three leaky inverter stages addresses the above issues to drive leaky stages symmetrically, and provide each of the leaky stages ample time for their output nodes to transition to the positive Vcc rail. In this manner, leakage measurements may be more accurate through a wider channel length range and/or through a wider temperature range, particularly when the temperature is high.

With continuing reference to FIG. 3, the remainder of the inverting stages for the exemplary leakage ring oscillator 300 includes conventional inverters 305–307 and NOR gates 310–312. The leakage ring oscillator 300 of one embodiment also includes two inverters 315 and 320 coupled in series to buffer an enable input 325 and two inverters 330 and 335 coupled in series to an output node 340 as shown. Dummy loads 345 and 350, equal in size to the output inverter 330, are coupled to the outputs of the inverter 305 and the inverter 307, respectively, to provide symmetric loads on all three sections of the oscillator.

As shown in FIG. 3, the exemplary leakage ring oscillator 300 includes two conventional CMOS inverting gates between its leaky stages. For other embodiments, a different number of intermediate conventional CMOS inverting gates may be used. Two inverting gates between each of the leaky gates may be beneficial for some embodiments because such a configuration does not allow the delays of the conventional inverting stages to be comparable to those of the leaky stages at high temperature.

For the embodiment shown in FIG. 3, one of the intermediate CMOS inverting stages between each of the leakage inverters is selected to be a NOR gate. In this manner, an enable signal received at the enable input 325 can be used to selectively enable and disable the leakage oscillator 300.

In particular, each one of the leakage inverter stages 301–303 is preceded by an associated enabling NOR gate 310–312, respectively. Using this approach, when the enable signal at the enable input 325 is de-asserted to disable the leakage oscillator 300, the outputs of the leakage inverters 301–303 are all strongly driven to Vcc (i.e. substantially fully turned on) by the p-type transistor in the respective NOR gate 310–312 instead of being held down only by the leaky n-type gate. In this manner, the output nodes of the leakage inverters 301–303 are prevented from floating in case the design is faulty. Floating output nodes of the leakage inverters could drive standing currents in the subsequent inverters.

The layout of the three output nodes of the leakage inverters 301–303 is designed to reduce coupling that might affect the nodes during the leaky transition of the output node discussed above. These oscillators may be operated when the host integrated circuit chip is quiet or active, as described in more detail below.

The ability to enable and disable the leakage ring oscillator when desired may be advantageous as compared to a free running oscillator in terms of power consumption. A free-running oscillator consumes power at all times, which may not be acceptable or desirable for many designs. A free-running oscillator may also create noise, albeit small, and may also be susceptible to multi-moding.

With continuing reference to FIG. 3, for proper operation of the leakage oscillator 300, the leakage oscillator 300 is designed such that, aside from node capacitance, the frequency of the oscillator is primarily sensitive to leakage and not to other device parameters in the CMOS inverter pairs, such as switching threshold. Inverting pairs comprising the intermediate conventional inverting stages 305 and 310, 306 and 311 and 307 and 312 determine the period of the oscillator 300 based on the position of the switching threshold of the first (and to some degree, the second) inverting stage in each pair, and the input gate capacitance of the first inverter.

To help prevent excessive movement of the gate capacitance and the switching threshold level of the first inverting stage in each pair, the channel widths of the devices in the first inverting stages 305–307 in each pair may be designed to be appreciably larger than the minimum process device width for one embodiment. The channel lengths of these devices may also be made longer than the minimum finished channel length.

Further, the switching threshold of the first inverting stage in each pair for some embodiments should, preferably, be skewed up toward the supply. This can be achieved by making W"p larger than W"n and/or by making L"n longer than L"p. The reason is that if the detection threshold is left in the center or low, then intercepting the decaying exponential voltage at the respective leakage node where it is shallow, can be fraught with timing uncertainty (affecting the resulting oscillator frequency) whenever that threshold level varies due to device parameter variations. Shifting the threshold upwards helps intercept the decaying exponential where it is steep, thus reducing the timing uncertainty.

Designing the oscillator 300 in this manner helps to reduce the effects of within-die variation of channel dimensions and channel doping and helps to stabilize the switching threshold level and input gate capacitance. As the channels are made longer, they begin to become a significant fraction of the node capacitance at the outputs of the leaky inverters 301–303 and detract from a true leakage measurement where oscillator frequency is proportional to the leakage per unit of leaky device channel width. It is not possible to make the node capacitance very highly dominated only by the leaky device drain capacitance since such a design would yield a very large leaky device (Wn'), but the design is directed to reducing the effects of other device parameters as described above within the constraints of the layout area, and the ability of the pull-up device to drive the node.

For some embodiments, simulations may be used after manufacture to account, at least in part, for the gate capacitance. Because leakage variations are relatively large, however, any large frequency fluctuations in the oscillator's output signal are more likely to be attributed to the leakage mechanism than to node capacitance variations.

The switching delay at the outputs of the inverters 305–307 is long due to the fact that they are switched high by the relatively low slew rate of the respective preceding leaky stages 303, 301 and 302 as the n-type devices of these leaky stages pull the inputs of the inverters 305–307 towards ground. Thus, the second inverting stages 310–312 in each of the inverting pairs between leaky inverter stages 301–303 are also designed to have a switching threshold that is relatively insensitive to within-die variations of channel length and threshold voltage. This is accomplished by designing the channel widths and lengths Wn, Ln and Wp, Lp of the n-type and p-type devices, respectively, in the second inverting stages 310–312 to be appreciably larger than the finished process minima for these dimensions.

It is further desirable for some embodiments to size the devices of the inverting stages 305–307 relative to the devices of the leakage inverters 303, 301 and 302 such that the input capacitances of each of the inverting stages 305–307 is smaller than that of each of the leaky stages 303, 301 and 302. For some embodiments, the devices of each of the inverting stages 305–307 are sized such that the input capacitance of the respective inverting stage is less than one tenth of the input capacitance of the associated leakage inverter stage. For other embodiments and/or processes, a different relative input capacitance value may be desirable.

For some embodiments, the devices of the NOR gates 310–312 are sized using close to standard CMOS sizing such that they are not so large as to cause signal transitions to slow down, but large enough such that their respective switching thresholds do not move much in response to variations in channel length and threshold.

In operation, in response to an enable signal being asserted at the enable input 325, the leakage oscillator 300 is enabled, and an oscillating output signal is provided at the output 340. The frequency of the oscillating output signal, as discussed above, is directly proportional to the source-to-drain channel leakage current of the n-type devices in the leakage inverters 301–303, which indicates the corresponding leakage current of surrounding devices.

Figure 4:
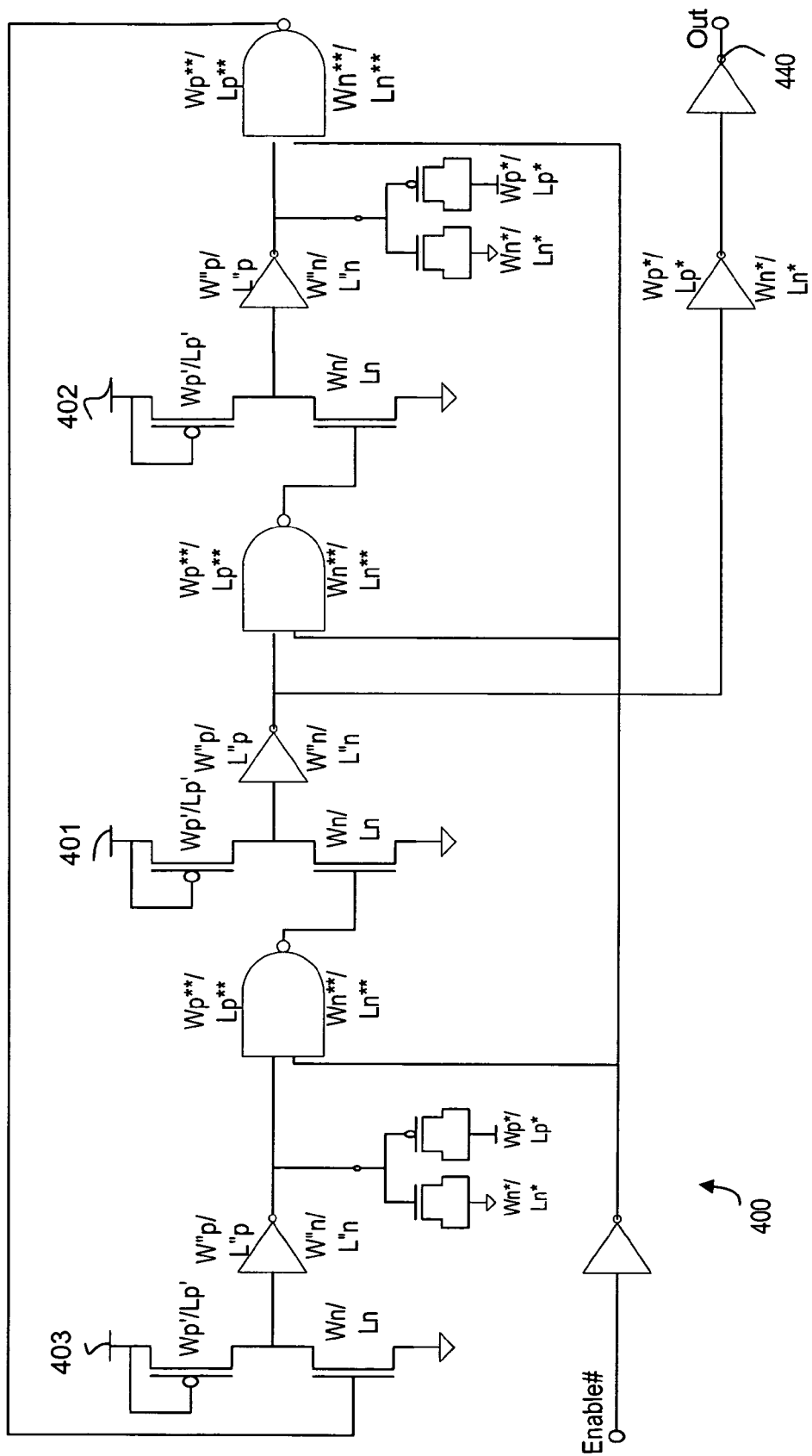

FIG. 4 is a schematic diagram of an analogous p-type leakage oscillator 400 that is configured and operates in a similar, but complementary manner. Design considerations for the devices in the p-type leakage oscillator 400 are similar to those discussed above for the n-type leakage oscillator 300 of FIG. 3, but adjusted for the complementary device types.

Similarly, the leakage oscillator 400 provides an oscillating signal at an output 440 that has an oscillation frequency determined by the drain leakage current of leaky p-type devices in p-type leakage inverters 401–403 and node capacitances at the outputs of the leakage inverters 401–403. In other words, the frequency of the oscillating signal provided by the leakage ring oscillator 400 is proportional to the drain leakage current of p-type devices in the leakage inverters 401–403.

For other embodiments, a similar ring oscillator may be provided using one or more of the gate leakage inverters of FIGS. 2A, 2B, 2C or 2D. Examples of such ring oscillators are shown in FIGS. 10, 11, 13 and 14, respectively.

Figure 5:
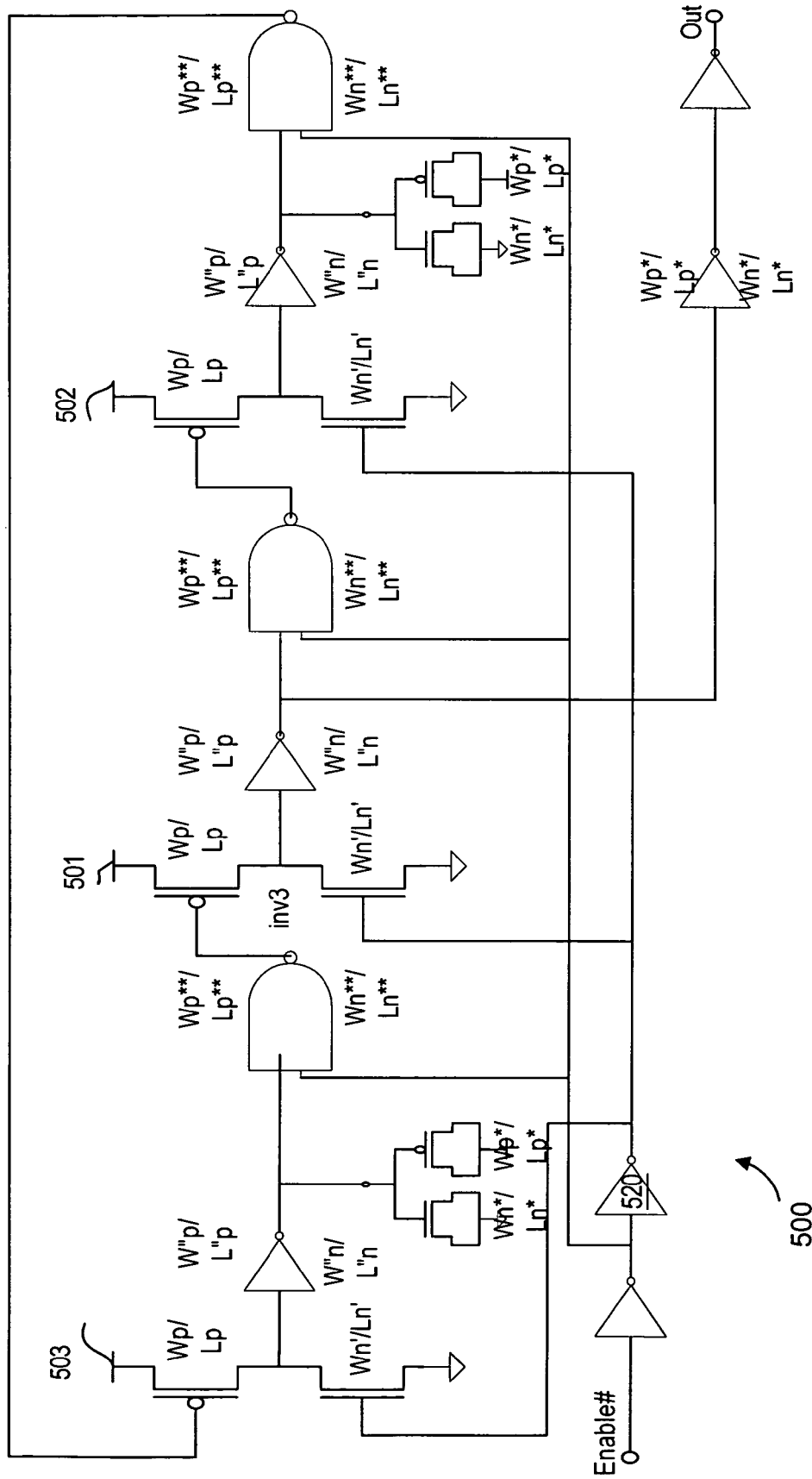
FIGS. 5 and 6 are schematic diagrams showing exemplary ring oscillator configurations that may be used to measure relative leakage for another embodiment.
Figure 6:
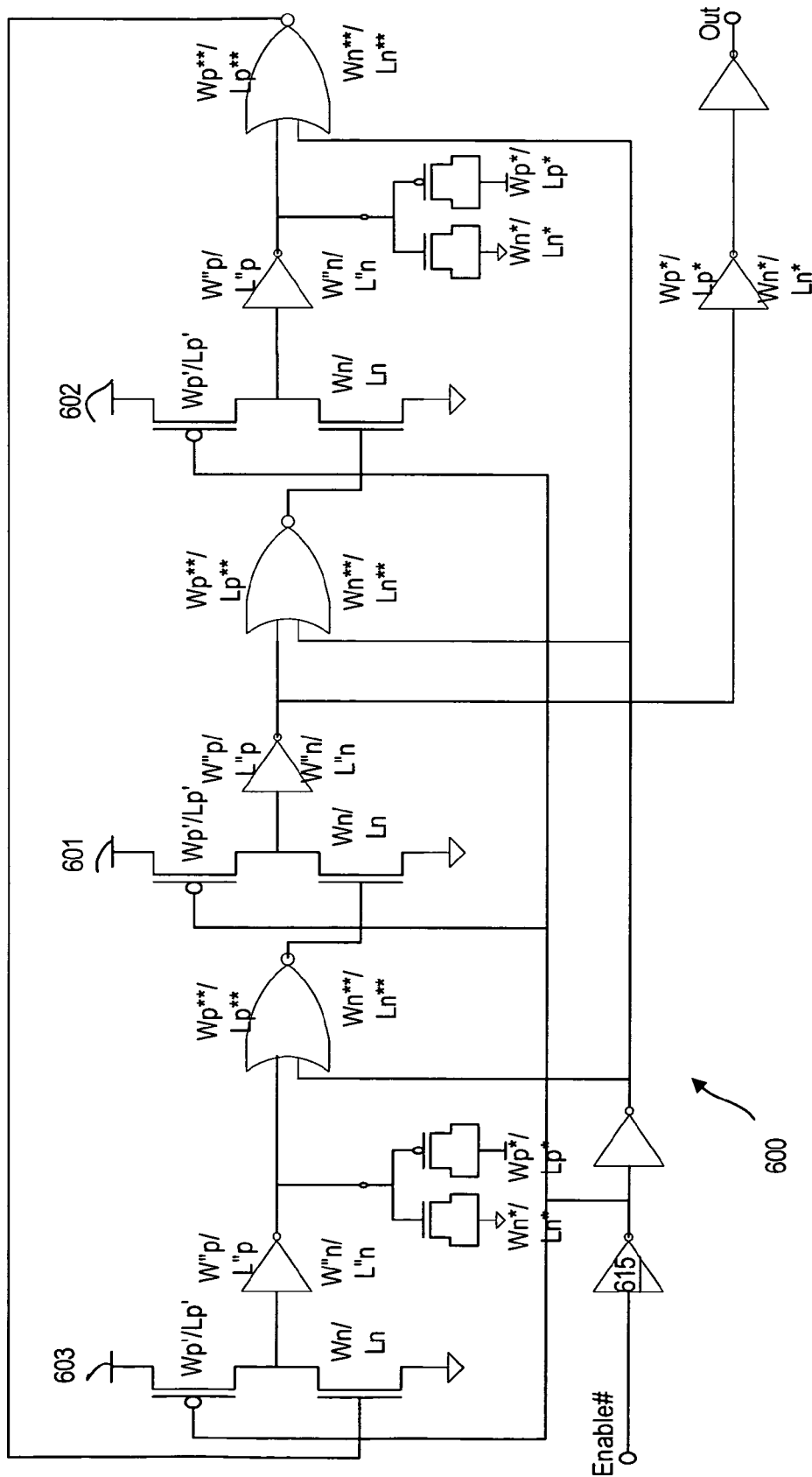

FIGS. 5 and 6 are schematic diagrams showing n-type and p-type leakage ring oscillators 500 and 600, respectively, of other embodiments. The leakage ring oscillator 500 shown in FIG. 5 is similar in design and operation to the corresponding leakage ring oscillator 300 of FIG. 3, except that the gates of leaky n-type devices of the leakage inverters 501–503 are coupled to an output of the inverter 520 to receive a delayed form of the enable signal (Enable# for one embodiment). For the complementary design shown in FIG. 6, the gates of leaky p-type devices of the leakage inverters 601–603 are coupled to an output of the inverter 615 to receive an inverted form of the enable signal.

For the embodiments shown in FIGS. 5 and 6, when the Enable# signal is de-asserted to disable the leakage ring oscillators 500 and 600, the leaky devices of the respective leakage inverters 501–503 and 601–603 are turned on while the pull-up pMOS (FIG. 5) or pull-down nMOS (FIG. 6) devices are turned off. This configuration reduces the standby (off state) leakage current of the respective oscillator compared to the embodiments of FIGS. 3 and 4, in which the leakage inverters continue to leak and the respective pull-up pMOS/pull-down nMOS devices remain ON when the leakage ring oscillator is disabled.

When the Enable# signal is asserted, the gates of the leaky devices of the leakage ring oscillators 501–503 and 601–603 are coupled to the same supply voltages as their sources for this embodiment.

Figure 7:
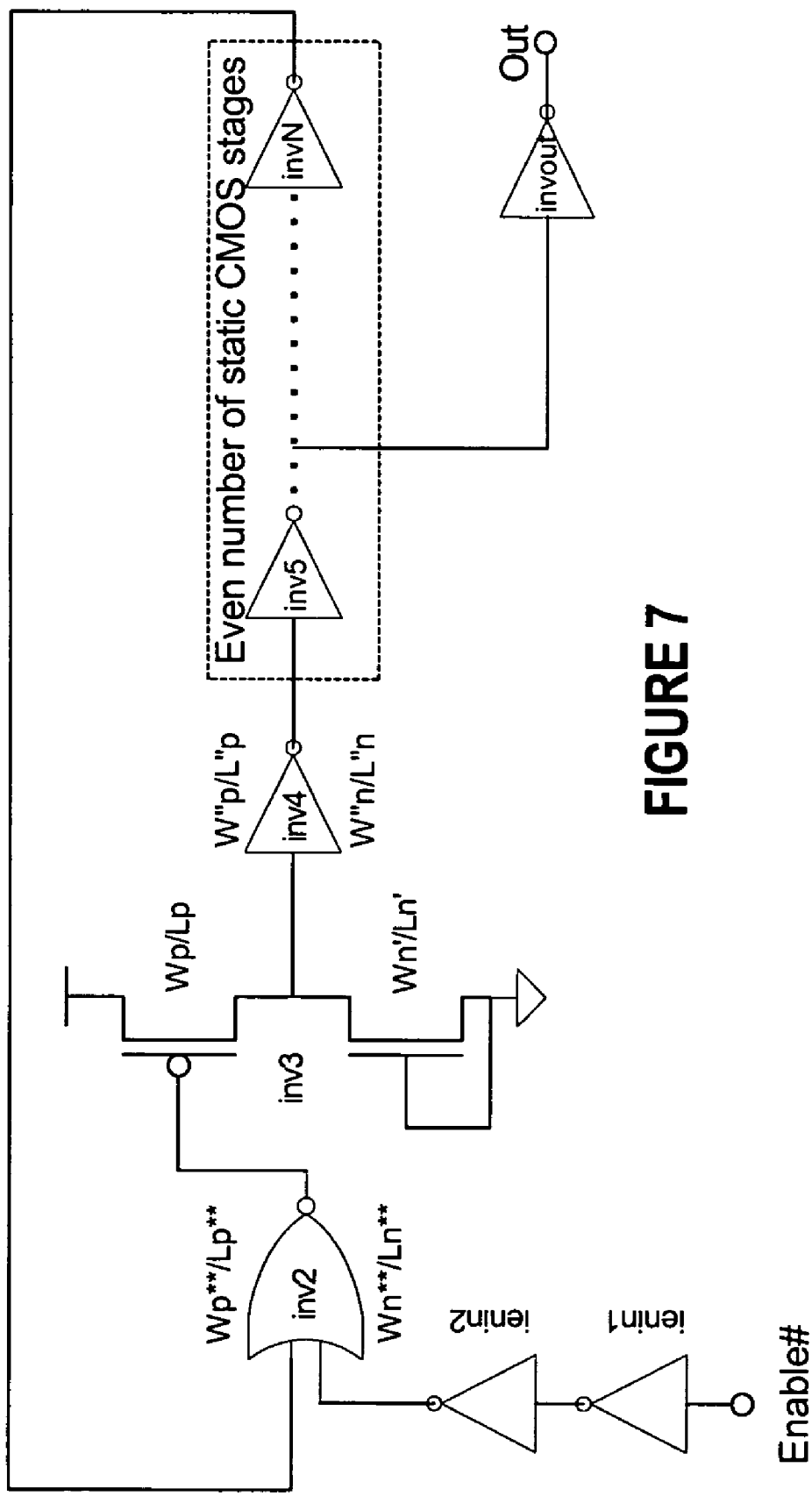
FIGS. 7 and 8 are schematic diagrams showing exemplary ring oscillators of another embodiment that may be used, for example, to develop temperature variation profiles.

FIG. 7 is a schematic diagram showing a leakage ring oscillator 700 of another embodiment that provides another possible application for the leakage inverter 100 of FIG. 1. The leakage ring oscillator 700 includes only one leakage inverter stage 701. Providing only one leakage inverter stage is not problematic in terms of the operation of the leakage ring oscillator 700 so long as the leakage ring oscillator 700 is used primarily for temperature measurements or for leakage measurements at low temperatures for the reasons discussed above.

In addition to the leakage inverter 701, the leakage ring oscillator 700 includes a NOR gate 710 coupled to a gate of a p-type device of the leakage ring oscillator 701, an inverter 706 coupled to an output of the leakage inverter 701 and a chain 709 including an even number of static CMOS inverters. The chain 709 of static CMOS inverters is designed to have an input-low-to-output-low total delay that is at least 5 or more times longer than the input-low-to-output-high delay of the leakage inverter 701. Using this design criterion, the small p-type device of the leakage inverter 701 is provided ample time to fully drive the output of the leakage inverter to the supply rail, even with worst-case within-die delay variations. Other design criteria including relative device sizing considerations are similar to those discussed above in reference to FIGS. 1–4.

In operation, at low temperature, the delay of the single leaky stage oscillator 700 is dominated by the time it takes the leaky n-type device of the leakage inverter 701 to slowly drain the charge at its output. At higher temperatures, within the range of acceptable host chip operation, the leakage current increases dramatically, causing the leakage-based delay to become a smaller fraction of the oscillator's cycle time. At this point, the delay of the chain of inverters 709 becomes a more significant fraction of cycle time, about 15–20 percent for some embodiments. Thus, the cycle time of the oscillator 700 output slowly departs from what it would have been had it been solely dominated by leakage, such that the oscillator 700 may provide inaccurate measurements of relative leakage current behavior at higher temperatures. This can be mitigated by measuring the phase of the oscillator output in which leakage is happening. Also, this does not, however, detract from the oscillator's capability to be used as a temperature probe, because proper calibration of its frequency versus chip temperature removes such non-ideal behavior.

Figure 8:
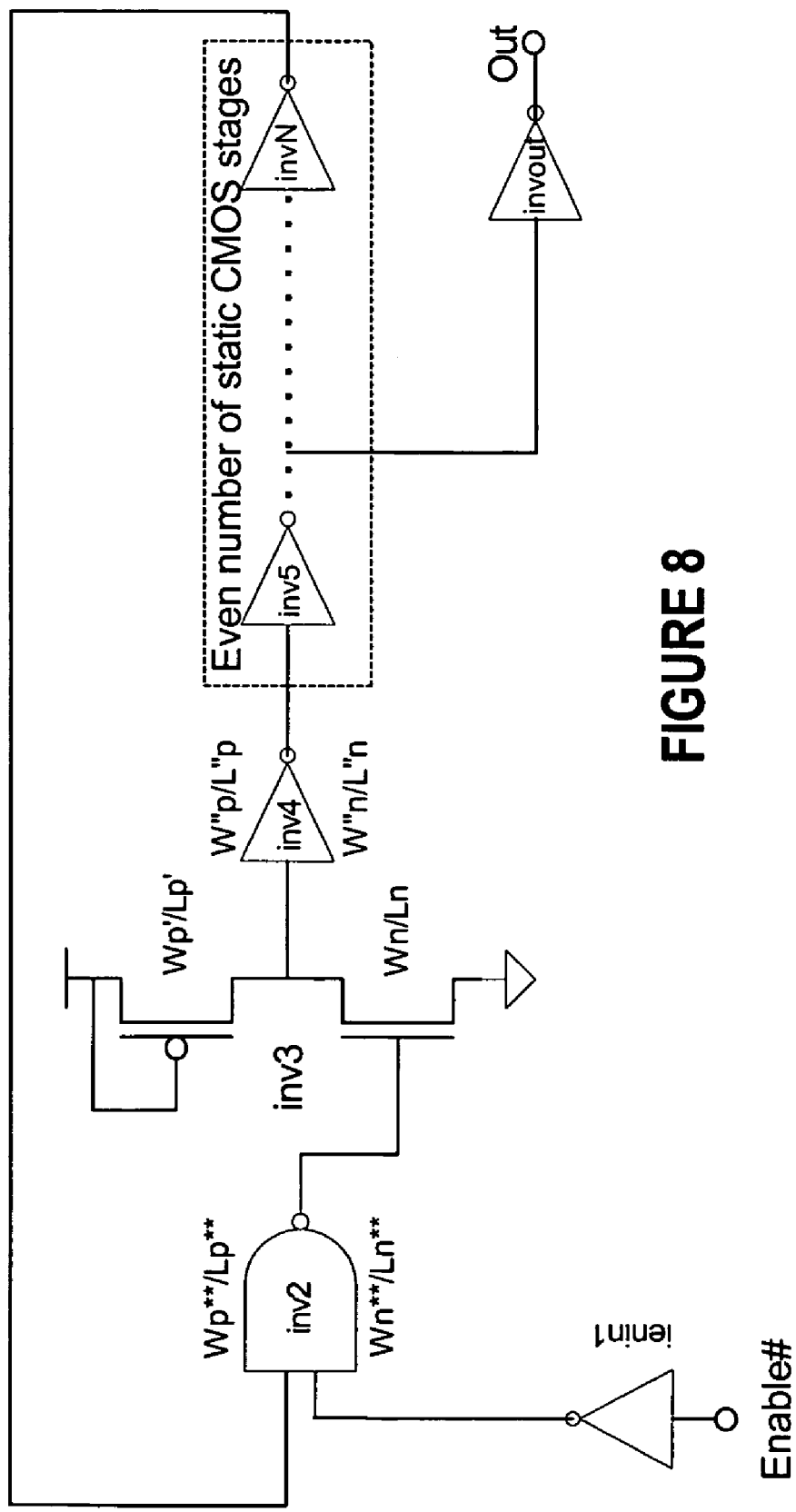

FIG. 8 is a schematic diagram of a complementary version 800 of the leakage ring oscillator 700 of FIG. 7 using a p-type leakage inverter 801. The leakage ring oscillator 800 is similar in operation and configuration to the leakage ring oscillator 700 with complementary design criteria. It will be appreciated that, for some embodiments, the leakage inverters 701 and/or 801 of FIGS. 7 and/or 8 may, instead of having their gates connected to supply as shown, have their gates coupled to receive a different supply voltage that provides a sub-threshold Vgs as described earlier.

The leakage ring oscillators 700 and 800 of FIGS. 7 and 8 may be used to indicate local temperatures at various points around a die to provide a die temperature profile.

For an alternative embodiment, similar leakage ring oscillators may be provided using one of the gate leakage inverters of FIG. 2A or 2B instead.

Figure 9:
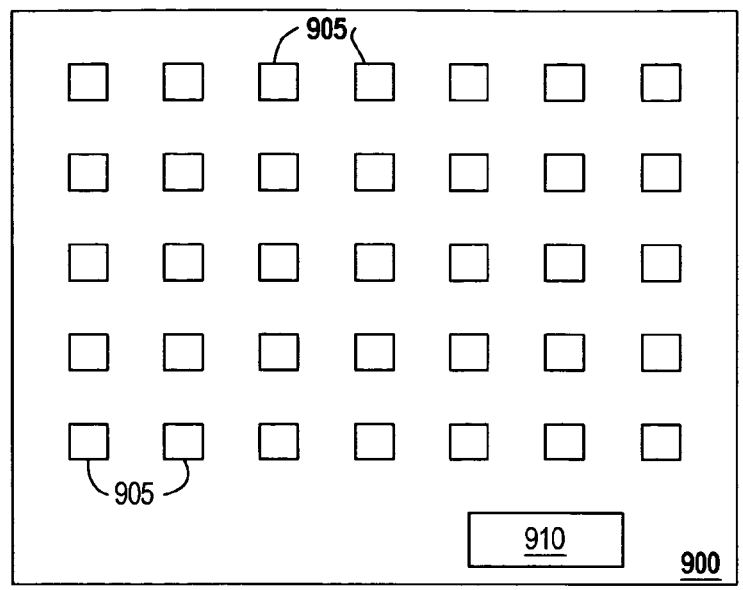
FIG. 9 is a high-level block diagram of a processor or other integrated circuit device that may include one or more of the ring oscillators of FIGS. 3, 4, 5, 6, 7 and/or 8.

FIG. 9 is a high-level block diagram of a host integrated circuit chip 900 that includes a plurality of ring oscillators 905, only a few of which are identified with reference numbers, disposed at various locations around the chip. For the embodiment shown in FIG. 9, one or more of the ring oscillators 905 are leakage ring oscillators according to one or more embodiments described herein. Conventional ring oscillators may also be included along with the leakage ring oscillators 905.

For one embodiment, the leakage ring oscillators 905 are located, to the extent possible, in a relatively regular grid across the die 900. For another embodiment, one or more of the leakage ring oscillators 905 may be selectively located near a region of interest. This may be a region that is particularly susceptible to leakage or that is particularly critical in terms of timing or temperature, for example.

The ring oscillators 905 of one embodiment are arranged and coupled to chip inputs and outputs in the manner described in U.S. Pat. No. 6,535,013 entitled, "Parameter Variation Probing Technique" issued Mar. 18, 2003 to Samaan, one of the inventors of the present invention. Using the arrangement described in the referenced patent, ring oscillators 905, including one or more ring oscillators according to one or more embodiments described herein, may be selectively enabled one at a time to provide temperature and/or leakage measurements in the manner described above. The outputs of ring oscillators 905 may be daisy-chained and coupled to an externally-accessible port or circuit such as a test access port (TAP) and/or control register system 910 as described in the aforementioned patent. In this manner, results of ring oscillator measurements may be provided via, for example, a structural or functional VLSI (very large scale integration) tester or other output device (not shown) coupled to the chip 900.

For one embodiment, where it is desirable to generate a temperature profile, many of the leakage ring oscillators 905 are implemented using one or more of the leakage ring oscillators of FIGS. 3–8, 10 and/or 11.

Figure 12:
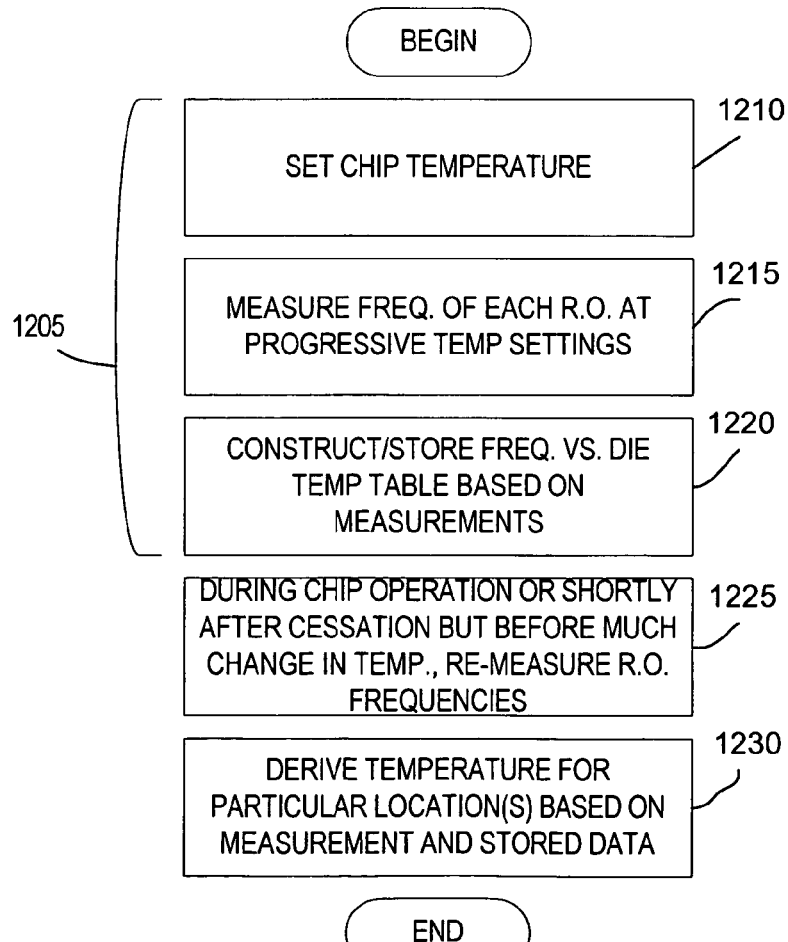
FIG. 12 is a flow diagram showing a method of one embodiment for testing within-die temperature variation.
Figure 10:
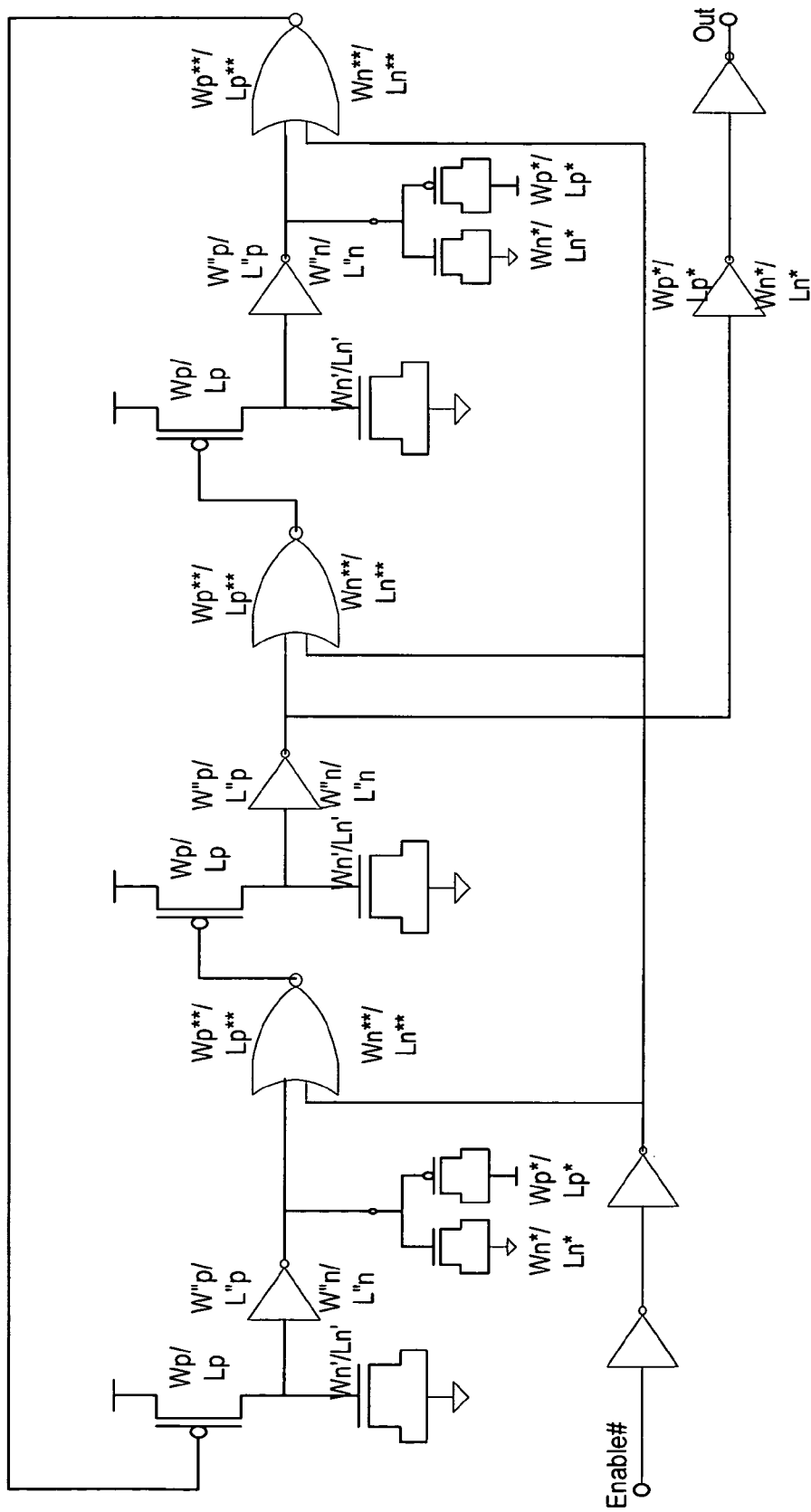
FIGS. 10 and 11 are schematic diagrams showing exemplary ring oscillators of another embodiment that include one or more of the leakage inverters of FIGS. 2A and 2B.
Figure 11:
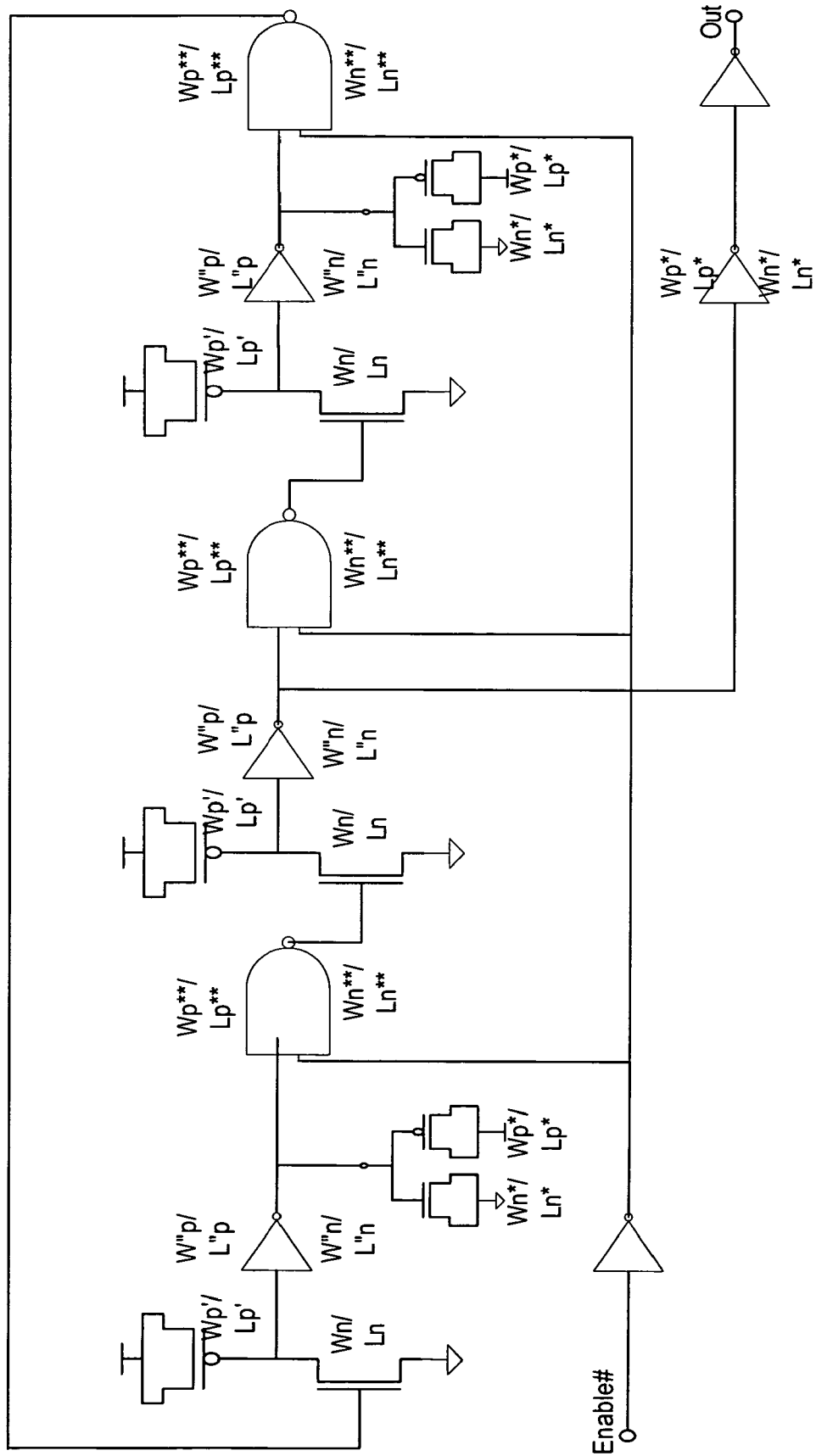
Figure 13:
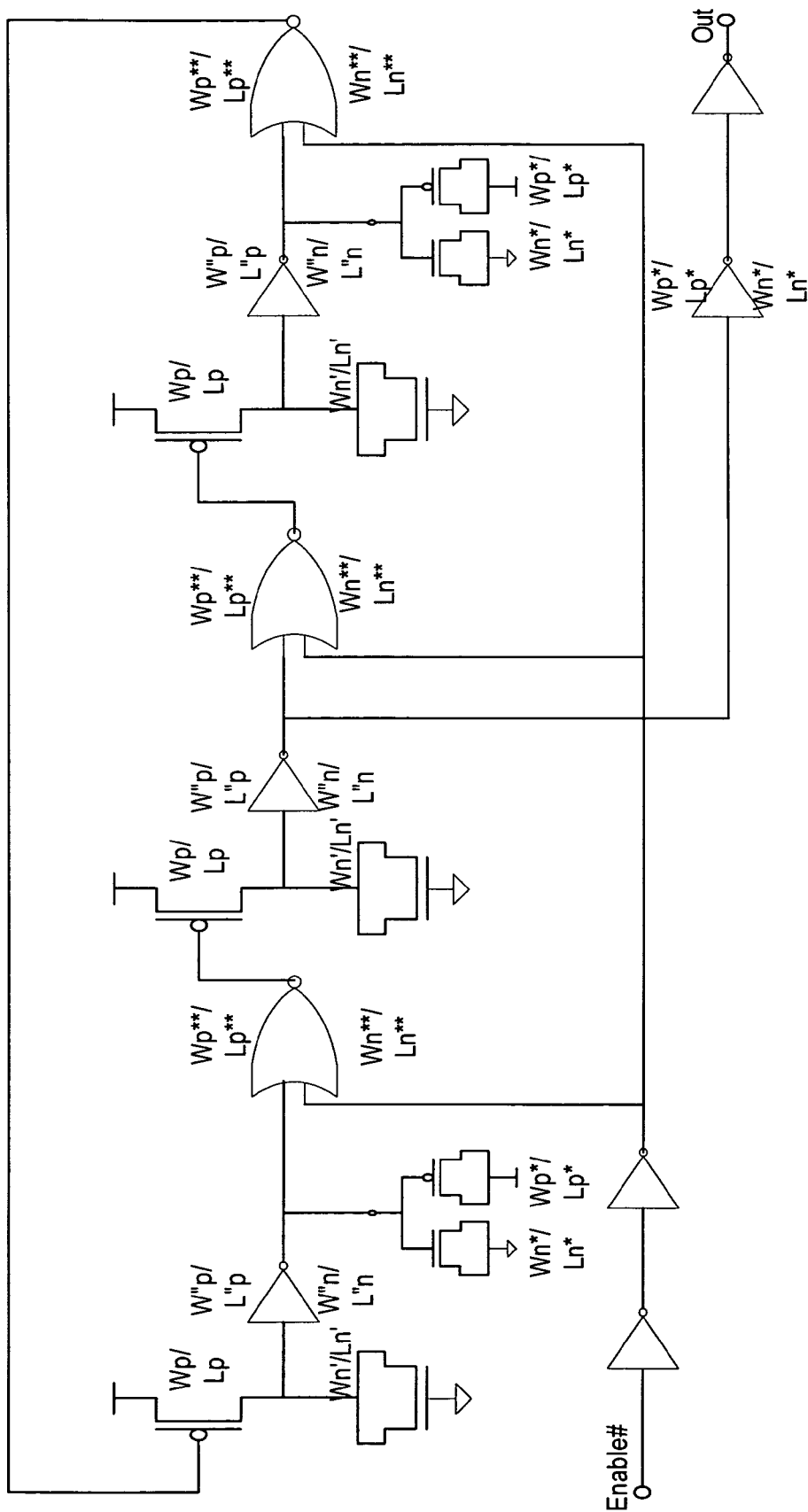
FIGS. 13 and 14 are schematic diagrams showing exemplary ring oscillators of another embodiment that include one or more of the leakage inverters of FIGS. 2C and 2D.
Figure 14:
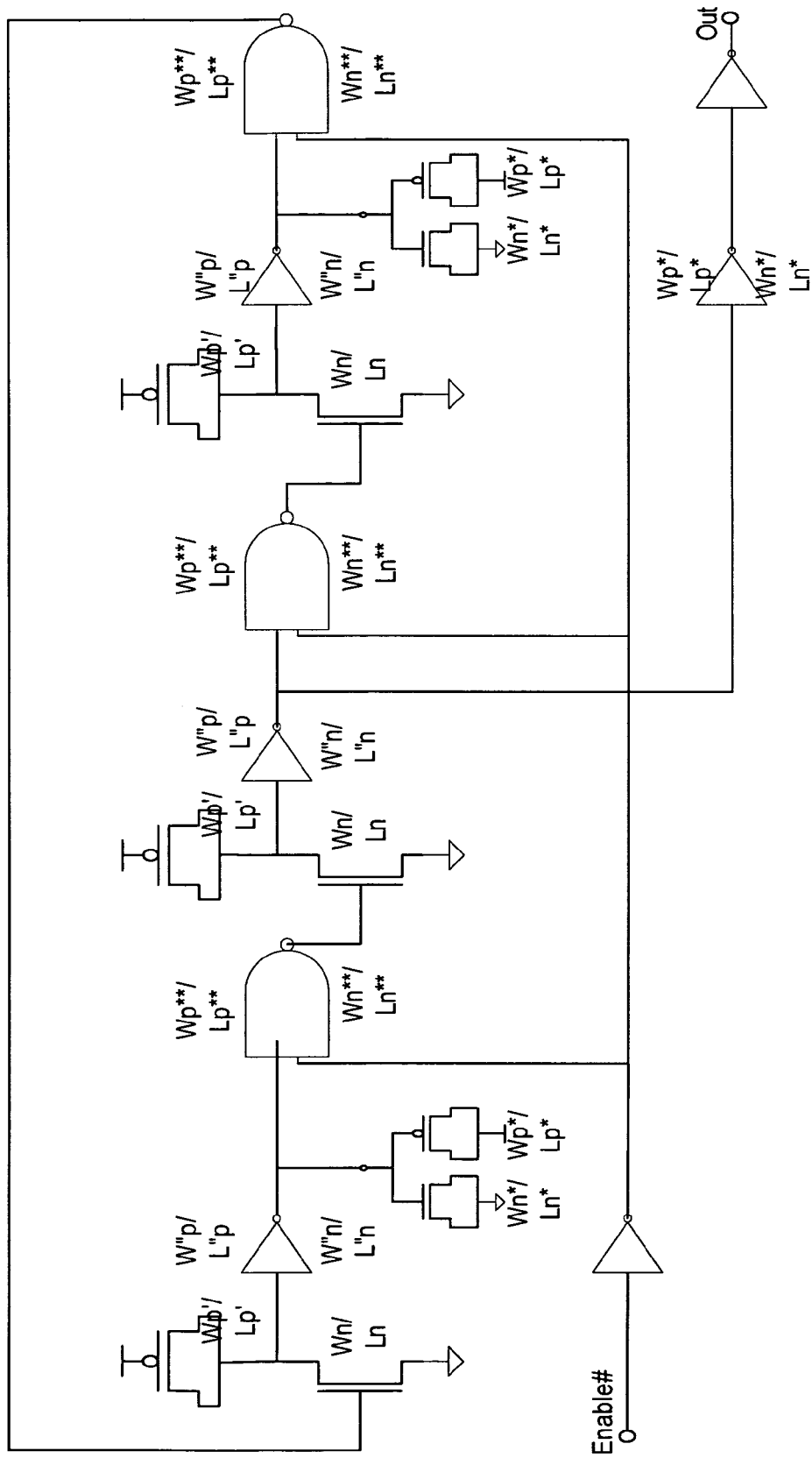

Referring to FIGS. 9 and 12, for one embodiment, prior to developing the desired temperature profile, a characterization process 1205 is performed to determine a correlation between leakage ring oscillator frequency and die temperature. To perform this characterization, with the chip quiet, its temperature may be set using, for example, a thermally controlled chuck or package on a test platform at block 1210. The frequency of each one of the leakage ring oscillators 905 is then measured at progressive temperature settings at block 1215. Based on the measured data, a table is then constructed at block 1220 identifying leakage oscillator frequency versus die temperature. This characterization is performed for each of the leakage inverters 905 that is to be used for temperature measurement. This characterization process may also be applied to other types of ring oscillators, for example, that may be used to measure temperature or for other purposes.

Once the characterization process has been completed, during chip operation, or very shortly after the chip runs a test pattern and is turned off, before its temperature profile changes appreciably, a tester is used at block 1225 to measure the frequencies of each of the indicated leakage ring oscillators. The table constructed during the characterization process is then used at block 1230 to derive the temperature at the locale of the particular oscillator.

For one embodiment, it is desirable to perform this test both shortly after the chip 900 is turned off and during operation of the chip 900 in order to determine whether the two tests yield the same temperature measurements. In this manner, it can be determined whether there has been any effect in terms of supply voltage (Vcc) droop to the leakage ring oscillators in the time period of interest. Simple thermal analysis and experiments can be used to show that the chip's temperature profile does not change appreciably within a certain time window following cessation of operation. The frequency of the leakage ring oscillators may then be measured during that time interval, when the chip 900 is quiet.

It will be appreciated that for other embodiments, other actions may be taken and/or not all of the above-described actions may be performed or they may be performed as parts of different processes or methodologies.

With continuing reference to FIG. 9, for another embodiment, many of the leakage ring oscillators 905 may be instead, or additionally, be implemented using one or more of the leakage ring oscillators of FIGS. 3–6 to measure relative leakage currents across the die 900 in a similar manner.

According to one or more of the above-described embodiments, it may be possible to relatively accurately and easily measure leakage and/or temperature at desired locations across an integrated circuit die. Such capabilities may enable tracking of device leakage, for example, within a die, wafer and/or manufacturing lot and may be used to track process trends over time.

Further, for some embodiments, the ability to measure chip temperature profiles accurately and easily may facilitate test and debug to identify hot-spots, maximum frequency limiting paths, and provide associated test patterns.

Thus, a method and apparatus for measuring relative within-die leakage currents and/or temperature variations using a leakage ring oscillator are described. In the foregoing specification, the invention has been described with reference to specific exemplary embodiments thereof. It will be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus comprising:
    an n-type and a p-type device coupled between first and second supply voltages at a terminal; and
    an output node coupled to the terminal, the output node, during operation of the apparatus, to provide an output signal having a switching delay in only one direction that is directly proportional to a leakage current of one of the n-type and p-type devices.

2. The apparatus of claim 1 wherein
    the n-type and p-type devices are coupled to function as an inverter.

3. The apparatus of claim 1 wherein
    drains of the n-type and p-type devices are coupled to each other at the terminal;
    a gate of a first one of the n-type and p-type devices is coupled to receive an input signal, and
    a gate of a second one of the n-type and p-type devices is coupled to receive a bias voltage during operation that results in the gate-to-source voltage of the second device being less than the threshold voltage of the second device.

4. The apparatus of claim 3 wherein the gate of the second device is coupled to the source of the second device.

5. The apparatus of claim 1 wherein
    a gate of a first one of the n-type and p-type devices is coupled to receive an input signal, and
    a gate of a second one of the n-type and p-type devices is coupled to the output node and the source and drain of the second one of the n-type and p-type devices are both coupled to receive one of the first and second supply voltages.

6. The apparatus of claim 1 wherein
    a gate of a first one of the n-type and p-type devices is coupled to receive an input signal,
    a gate of a second one of the n-type and p-type devices is coupled to receive one of the first and second supply voltages, and
    a source and drain of the second device are both coupled to the output node.

7. An apparatus comprising:
    a ring oscillator including,
    at least one leakage inverter to provide an inverted output signal having a signal transition delay in only one direction that is proportional to a leakage current of a device of the first leakage inverter, and
    one or more static stages, the ring oscillator to provide an oscillating output signal.

8. The apparatus of claim 7 wherein
    the at least one leakage inverter includes a leaky device having a gate coupled to a receive a bias voltage during operation, the bias voltage being a sub-threshold gate-to-source voltage, and
    wherein the leakage current is a drain leakage current.

9. The apparatus of claim 8 wherein
    the gate of the leaky device is coupled to receive an enable signal, the leaky device to be turned on in response to the enable signal being deasserted.

10. The apparatus of claim 7 wherein,
    the at least one leakage inverter includes a leaky device having a source and drain coupled to receive a supply voltage and a gate coupled to an output node of the leakage inverter, and
    wherein the leakage current is a gate leakage current.

11. The apparatus of claim 7 wherein,
    the at least one leakage inverter includes a leaky device having a gate coupled to receive a supply voltage and a source and drain coupled to an output node of the leakage inverter.

12. The apparatus of claim 7 wherein,
    the ring oscillator includes at least three leakage inverters, and
    wherein a frequency of the oscillating output signal varies in proportion to the leakage current of the device.

13. An apparatus comprising:
an enable input to receive an enable signal; and
a leakage ring oscillator to be enabled in response to the enable signal being asserted, the leakage ring oscillator including
at least a first leakage inverter including a leaky device, the leaky device to be substantially fully turned on in response to the enable signal being deasserted; and
an output to provide an oscillating output signal in response to the leakage ring oscillator being enabled, a frequency of the oscillating output signal being dependent upon a leakage current of the first leakage inverter while the leakage ring oscillator is enabled.

14. The apparatus of claim 13 wherein the leakage ring oscillator includes at least three leakage inverters, each of the three leakage inverters including a leaky device to be substantially fully turned on and another device to be substantially fully turned off in response to the enable signal being deasserted.

15. The apparatus of claim 14 wherein at least one of the three leakage inverters includes a device coupled to receive a sub-threshold gate-to-source voltage in response to the enable signal being asserted.

16. The apparatus of claim 14 wherein at least one of the three leakage inverters includes a device having a source and drain coupled to receive a same supply voltage and a gate coupled to an output of the leakage inverter.

17. The apparatus of claim 14 wherein at least one of the three leakage inverters includes a device having a gate coupled to receive a supply voltage and a source and drain both coupled to an output of the leakage inverter.

18. The apparatus of claim 14 wherein at least one of the three leakage inverters is coupled such that the leakage current is a drain leakage current.

19. The apparatus of claim 14 wherein at least one of the three leakage inverters is coupled such that the leakage current is a gate leakage current.

20. An integrated circuit comprising:
a plurality of leakage ring oscillators, each of the leakage ring oscillators including at least a first leakage inverter to provide an inverted output signal having a transition delay in one direction that is proportional to a leakage current of a device of the leakage inverter, each of the plurality of leakage ring oscillators to provide an oscillating output signal, a frequency of the respective oscillating output signal to indicate at least one of a local temperature and leakage current; and
an externally-accessible output circuit coupled to receive the oscillating output signal.

21. The integrated circuit of claim 20 wherein the externally-accessible output circuit is a test access port.

22. The integrated circuit of claim 20 wherein the externally-accessible output circuit includes a control register.

23. The integrated circuit of claim 20 wherein
at least one of the leakage ring oscillators includes at least three leakage inverters.

24. The integrated circuit of claim 23 wherein the at least three leakage inverters indicate local gate leakage.

25. The integrated circuit of claim 23 wherein the at least three leakage inverters indicate local channel leakage.

26. A method comprising:
detecting a frequency of a leakage ring oscillator on an integrated circuit, the leakage ring oscillator including at least a first leakage inverter to provide an inverted output signal having a transition delay in only one direction that is proportional to a leakage current of a device of the leakage inverter over a first temperature range; and
determining one of a local temperature or relative leakage current in response to the detected frequency.

27. The method of claim 26 wherein determining comprises
accessing data indicating leakage ring oscillator frequency versus at least one of temperature and leakage current.

28. The method of claim 26 further comprising:
characterizing each of the leakage ring oscillators at different temperatures; and
developing a look-up table indicating frequency of the oscillating output signal versus temperature.

* * * * *